United States Patent [19]

Munson

[11] Patent Number: 5,900,734
[45] Date of Patent: May 4, 1999

[54] LOW BATTERY VOLTAGE DETECTION AND WARNING SYSTEM

[76] Inventor: Edward J Munson, 1545 Oaklawn Ave., Southold, N.Y. 11971

[21] Appl. No.: 08/995,837

[22] Filed: Dec. 22, 1997

[51] Int. Cl.$^6$ ........................................ G01N 27/416
[52] U.S. Cl. .......................... 324/433; 324/435; 340/636
[58] Field of Search .................... 324/426, 427, 324/429, 433, 435; 340/636; 320/134, 136

[56] References Cited

U.S. PATENT DOCUMENTS

| | | | |
|---|---|---|---|
| 4,536,757 | 8/1985 | Ijntema ............................. | 324/433 |
| 4,665,370 | 5/1987 | Holland ............................ | 324/433 |
| 4,719,428 | 1/1988 | Liebermann ..................... | 324/427 |
| 4,823,086 | 4/1989 | Whitmire et al. ............... | 324/433 |
| 4,906,055 | 3/1990 | Horiuchi .......................... | 324/433 |
| 4,916,438 | 4/1990 | Collins et al. .................. | 340/636 |
| 4,968,942 | 11/1990 | Palanisamy ..................... | 324/433 |
| 5,099,210 | 3/1992 | Fortney et al. .................. | 324/433 |
| 5,239,286 | 8/1993 | Komatsuda ...................... | 324/433 |
| 5,281,919 | 1/1994 | Palanisamy ..................... | 324/427 |
| 5,444,378 | 8/1995 | Rogers ............................. | 324/428 |
| 5,610,525 | 3/1997 | Yoshida et al. ................. | 324/433 |

*Primary Examiner*—Diep N. Do
*Attorney, Agent, or Firm*—Michael I. Kroll

[57] ABSTRACT

A low battery voltage detection and warning system connected to sense a voltage charge of a power source within a vehicle such as the vehicle battery. The low battery voltage detection and warning system includes a voltage sensor connected to the power source for sensing a voltage value of the power source and a processing device connected to the voltage sensor for comparing the sensed voltage value to a reference value and determining if the sensed voltage value is less than the reference value. An alarm is connected to the processing device for generating an alarm upon a determination by the processing device that the sensed voltage value is less than the reference value. The alarm may produce at least one of an audible and visual alarm to alert the operator of the vehicle that the battery voltage is low and should be checked. The determination that the battery voltage is low indicates that the vehicle will only start a few more times before the battery is charged to a value too small to start the vehicle.

3 Claims, 7 Drawing Sheets

LOW BATTERY VOLTAGE DETECTION AND WARNING SYSTEM

A condition tester for a storage battery that monitors the effects of internal battery resistance without drawing large currents. A switched load periodically draws a small current across the battery terminals. An AC voltage is produced at the battery terminals resulting from the oscillating current and the internal battery resistance. That small oscillating voltage is amplified, rectified and filtered to produce a DC voltage which depends upon the AC component. This DC voltage is subtracted from the nominal battery voltage and the difference is indicated by an appropriate meter. As the battery deteriorates its internal resistance increases causing the meter reading to decrease, thereby reflecting battery condition.

An aircraft storage battery is monitored to determine battery capacity, state of charge and certain fault conditions. The ambient temperature, battery voltage onboard charger output voltage and current to and from the battery are continuously measured. Current voltage (I-V) data is analyzed to determine the internal resistance and polarization of the battery. A determination is made regarding state of charge and fault conditions produced by corroded terminals and low electrolyte level. The low temperature starting limit is determined by comparing the battery's power output capability with starting power requirements of the aircraft. Data produced by the comparison are indicated on the dashboard of the vehicle.

A vehicle storage battery is monitored to determine battery capacity, state of charge and certain fault conditions. The ambient temperature, battery voltage alternator regulator output voltage and current to and from the battery are continuously measured. Current voltage (I-V) data is analyzed to determine the internal resistance and polarization of the battery. A determination is made regarding state of charge and fault conditions produced by corroded terminals and low electrolyte level. The low temperature starting limit is determined by comparing the battery's power output capability with starting power requirements of the vehicle. Data produced by the comparison are indicated on the dashboard of the vehicle.

An apparatus and method for monitoring the state of charge of the battery having a shunt resistor connected in series with a battery and an integrating circuit connected across the terminals of the shunt resistor which includes a large capacitance element having the capability to store charge for long periods of time, so that the integration can be performed along the same curve even if power to the integrating circuit is interrupted during continuous or intermittent use. The apparatus and method are applicable to batteries for automotive vehicles. Temperature compensation schemes to adjust the state of charge monitoring circuit to correct for changes in battery performance characteristics with temperature are provided. A circuit for detecting the existence of a defective battery cell is provided. A system for monitoring charging and discharging of the battery over time and identifying various battery conditions and potential battery or battery charging system failures is provided.

SUMMARY OF THE PRESENT INVENTION

The present invention relates generally to voltage level detection systems and, more specifically, to a system for sensing the voltage charge of a vehicle battery and warning an operator of the vehicle as to a low battery voltage charge.

A primary object of the present invention is to provide a low battery voltage detection and warning system that will overcome the shortcomings of prior art devices.

Another object of the present invention is to provide a low battery voltage detection and warning system which is able to measure a vehicle battery voltage.

An additional object of the present invention is to provide a low battery voltage detection and warning system including a device for determining if the battery voltage is below a predefined minimum value.

A still further object of the present invention is to provide a low battery voltage detection and warning system that is able to warn the operator of the vehicle that the battery voltage is low and should be checked.

An even further object of the present invention is to provide a low battery voltage detection and warning system including at least one of an audible and visual alarm for alerting the operator of the vehicle as to a low voltage measurement for the battery.

A still further object of the present invention is to provide a low battery voltage detection and warning system which is activated by the turning of the vehicle ignition to sense the start-up voltage of the vehicle battery and indicate if the vehicle battery voltage is above a predetermined value.

A yet further object of the present invention is to provide a low battery voltage detection and warning system which includes a visual alarm able to indicate both low and normal battery voltage levels.

Another object of the present invention is to provide a low battery voltage detection and warning system that is simple and easy to use.

A still further object of the present invention is to provide a low battery voltage detection and warning system that is economical in cost to manufacture.

Additional objects of the present invention will appear as the description proceeds.

A low battery voltage detection and warning system connected to sense a voltage charge of a power source within a vehicle such as the vehicle battery is disclosed by the present invention. The low battery voltage detection and warning system includes a voltage sensor connected to the power source for sensing a voltage value of the power source and a processing device connected to the voltage sensor for comparing the sensed voltage value to a reference value and determining if the sensed voltage value is less than the reference value. An alarm is connected to the processing device for generating an alarm upon a determination by the processing device that the sensed voltage value is less than the reference value. The alarm may produce at least one of an audible and visual alarm to alert the operator of the vehicle that the battery voltage is low and should be checked. The determination that the battery voltage is low indicates that the vehicle will only start a few more times before the battery is charged to a value too small to start the vehicle.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWING FIGURES

Various other objects, features and attendant advantages of the present invention will become more fully appreciated as the same becomes better understood when considered in conjunction with the accompanying drawings, in which like reference characters designate the same or similar parts throughout the several views.

DETAILED DESCRIPTION OF THE PREFERRED EMBODIMENT

Figure 1:
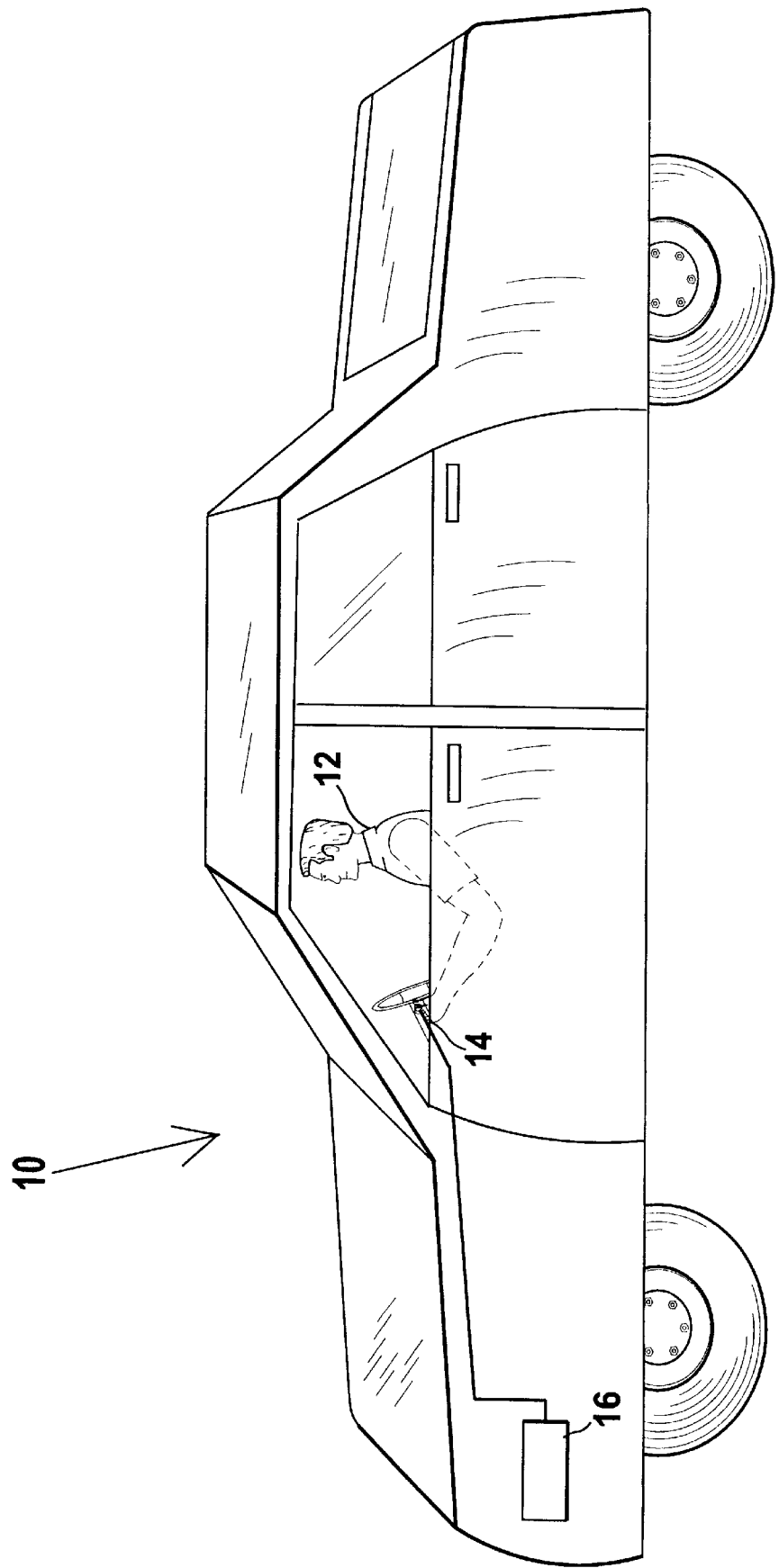
FIG. 1 is a perspective side view of an operator of a vehicle attempting to start a vehicle having a voltage drained battery.

Turning now descriptively to the drawings, in which similar reference characters denote similar elements throughout the several views, FIG. 1 illustrates a vehicle 10 without the low battery voltage detection and warning system of the present invention installed therein. An operator 12 is seated within the vehicle 10 and is attempting to start the vehicle 10 by turning a key in the ignition 14. As can be seen from this figure and as is common in all conventional vehicles the ignition 14 is connected to the vehicle battery 16. When a key is placed in the ignition 14 and turned, the vehicle battery 14 is connected to start the vehicle 10. When the voltage of the vehicle battery 14 is drained, it is unable to provide enough voltage to start the vehicle 10. The operator 12 must then either have the battery charged or replaced. If the operator 12 is pre-warned as to the charge capacity remaining in the battery appropriate precautions may be taken to avoid being caught with a dead battery.

Figure 2:
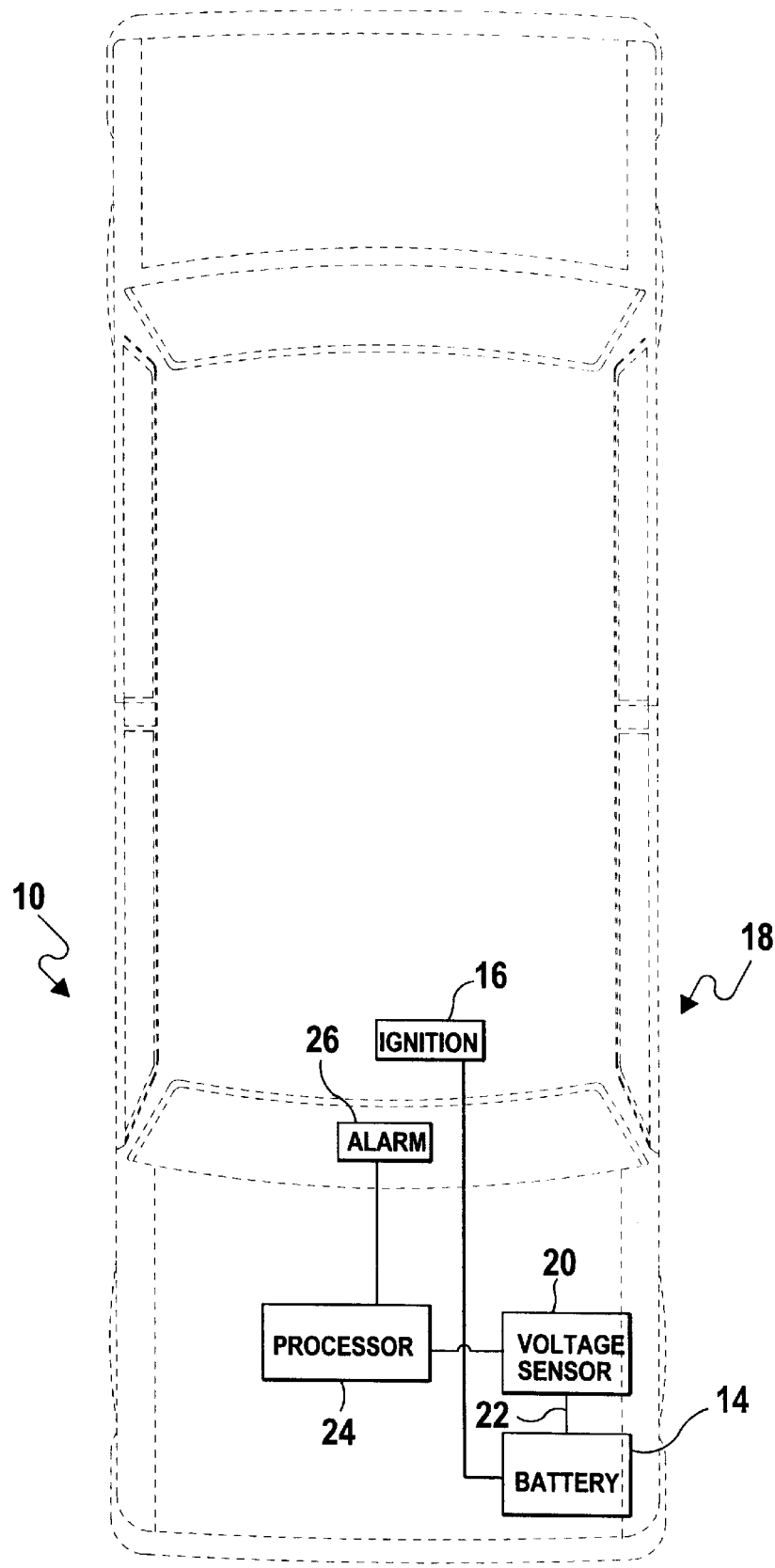
FIG. 2 is a perspective top view of a vehicle equipped with the low battery voltage detection and warning system of the present invention, the vehicle shown in phantom.
Figure 3:
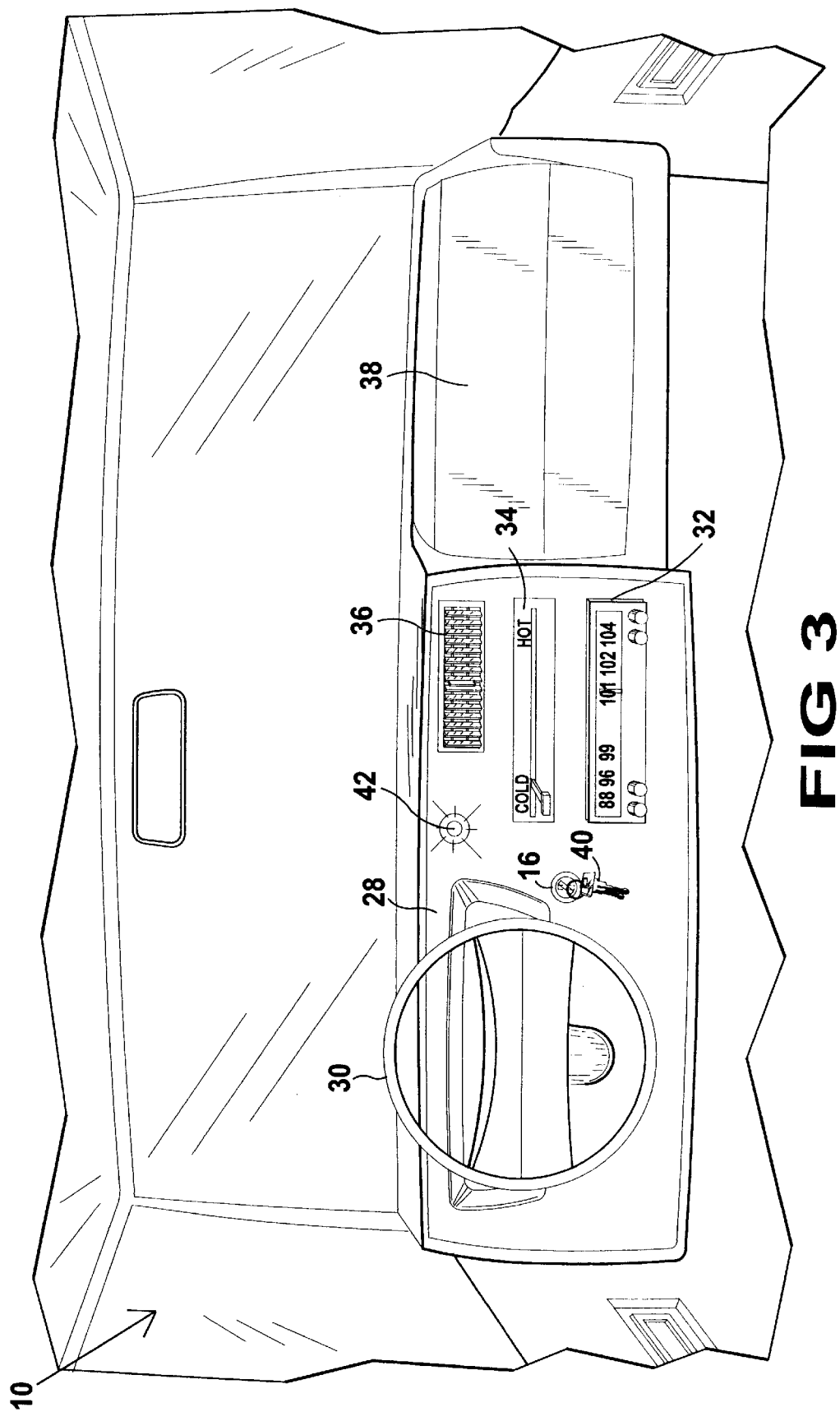
FIG. 3 is a perspective front view of a dashboard within a vehicle equipped with the low battery voltage detection and warning system of the present invention.

FIGS. 2 through 5 illustrate the low battery voltage detection and warning system of the present invention which is indicated generally by the numeral 18. The low battery voltage detection and warning system 18 is installed within a vehicle 10 such as an automobile as illustrated in FIGS. 2 and 3. The installation of the low battery voltage detection and warning system 18 in an automobile is for purposes of example only as the low battery voltage detection and warning system 18 can be installed in and utilized by any vehicle such as a truck, van, bus, motorcycle, moped, boat, airplane, all space vehicles etc. or even any device which is powered by a voltage source such as an electric lawnmower.

The low battery voltage detection and warning system 18 is installed within a vehicle 10 as is illustrated in FIG. 2 and includes a voltage sensor 20 connected to the vehicle battery 14 via a wired connection 22. The voltage sensor 20 is connected to provide the sensed voltage to a processor 24 which analyzes the sensed voltage to determine if the battery voltage is below a predetermined value. The processor 24 is connected to an alarm 26 preferably located within the cabin of the vehicle 10 for providing at least one of an audible and visual indication to the operator when the processor 24 determines that the voltage or charging capacity of the vehicle battery 14 is below a predetermined value. The alarm 26 is preferably connected to or installed within the dashboard of the vehicle 10 as is illustrated in FIG. 3. However, the illustration of the alarm 26 attached to or contained within the dashboard is for purposes of description only and not meant to limit the invention in any manner. The alarm 26 may be positioned at any place within the vehicle as long as it is able to alert the operator as to the charging voltage of the vehicle battery 14.

FIG. 3 illustrates the dashboard 28 of a vehicle 10 in which the low battery voltage detection and warning system 18 of the present invention is installed. This figure illustrates all the conventional items normally found on the dashboard 28 of a vehicle 10. Such items include a steering wheel 30, a radio 32, a heater control unit 34, an air vent 36 and a glove compartment 38. A key 40 is also shown in the ignition 16, whereby when the key 40 is turned the battery applies voltage to start the vehicle 10. A visual alarm 42 connected to the processor 24 of the low battery voltage warning system 18 is positioned on the dashboard 28 so as to be readily viewable by the operator of the vehicle 10 upon activation and illumination when the key 40 is turned and the battery voltage is determined to be below the predetermined value. The visual alarm 42 in the figure is illuminated indicating the battery voltage is low.

Figure 4:
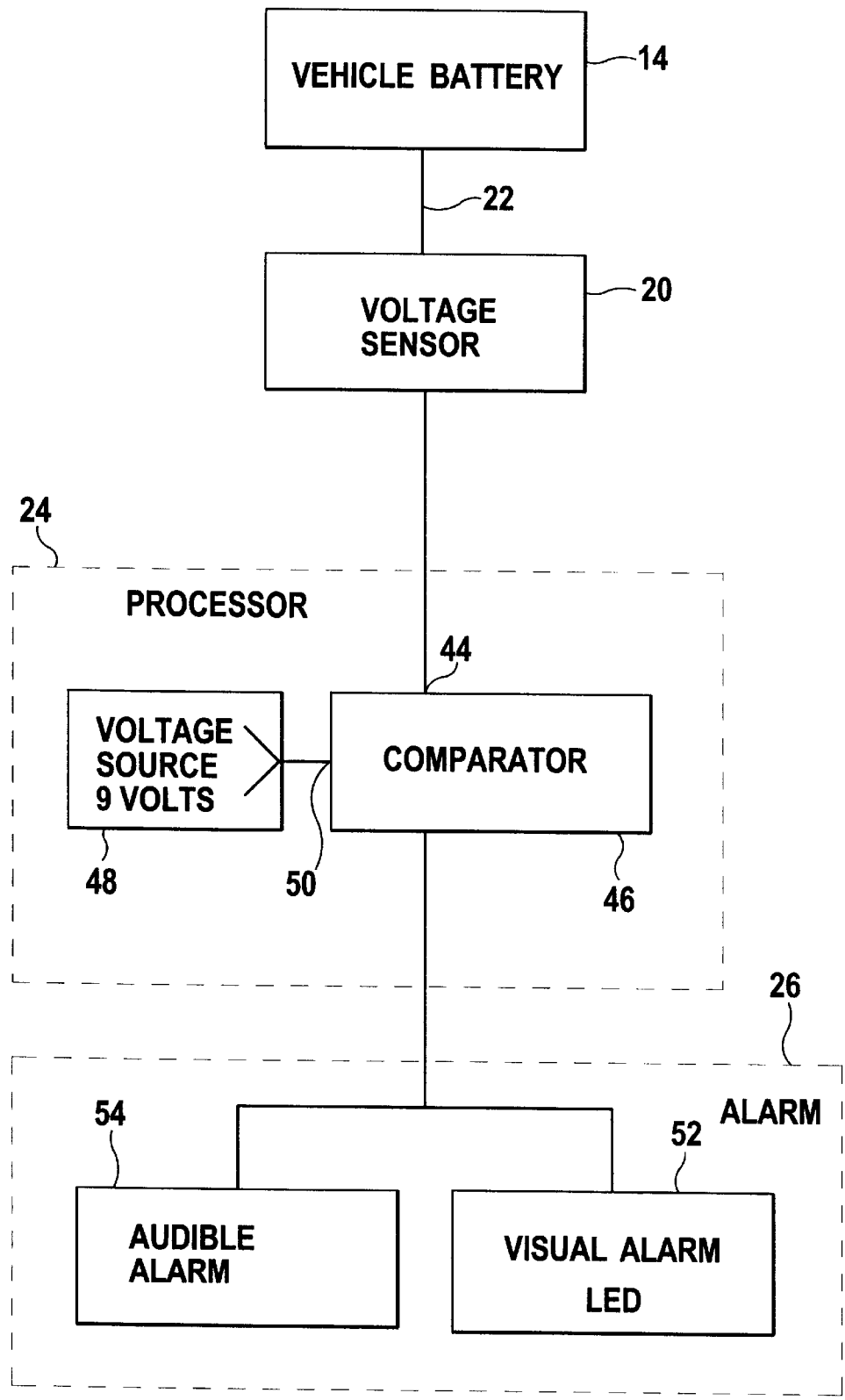
FIG. 4 is a block diagram of the low battery voltage detection and warning system of the present invention.

A schematic block diagram of the low battery voltage detection and warning system 18 installed within the vehicle 10 is shown in FIG. 4. As is clearly shown in this figure the low battery voltage warning system 18 includes a voltage sensor 20 connected to the vehicle battery 14 via a connection line 22. The voltage sensor 20 is connected to a first input terminal 44 of a comparator 46 within the processor 24. A voltage source 48 generates a reference voltage and supplies the generated reference voltage to a second input port 50 of the comparator 46. The comparator 46 compares the sensed voltage value to the reference voltage value and upon determining the sensed voltage value is less than the reference voltage value, a signal is transmitted to the alarm 26 indicating the battery voltage is below a predetermined warning value. The alarm 26 includes at least one of a visual alarm 52 and an audible alarm 54. The visual alarm 52 is preferably positioned within the cabin of the vehicle so as to be readily visible by the operator of the vehicle when activated. The audible alarm 54 is also preferably positioned within the cabin of the vehicle so as to be easily heard by the operator of the vehicle when activated.

Figure 5:
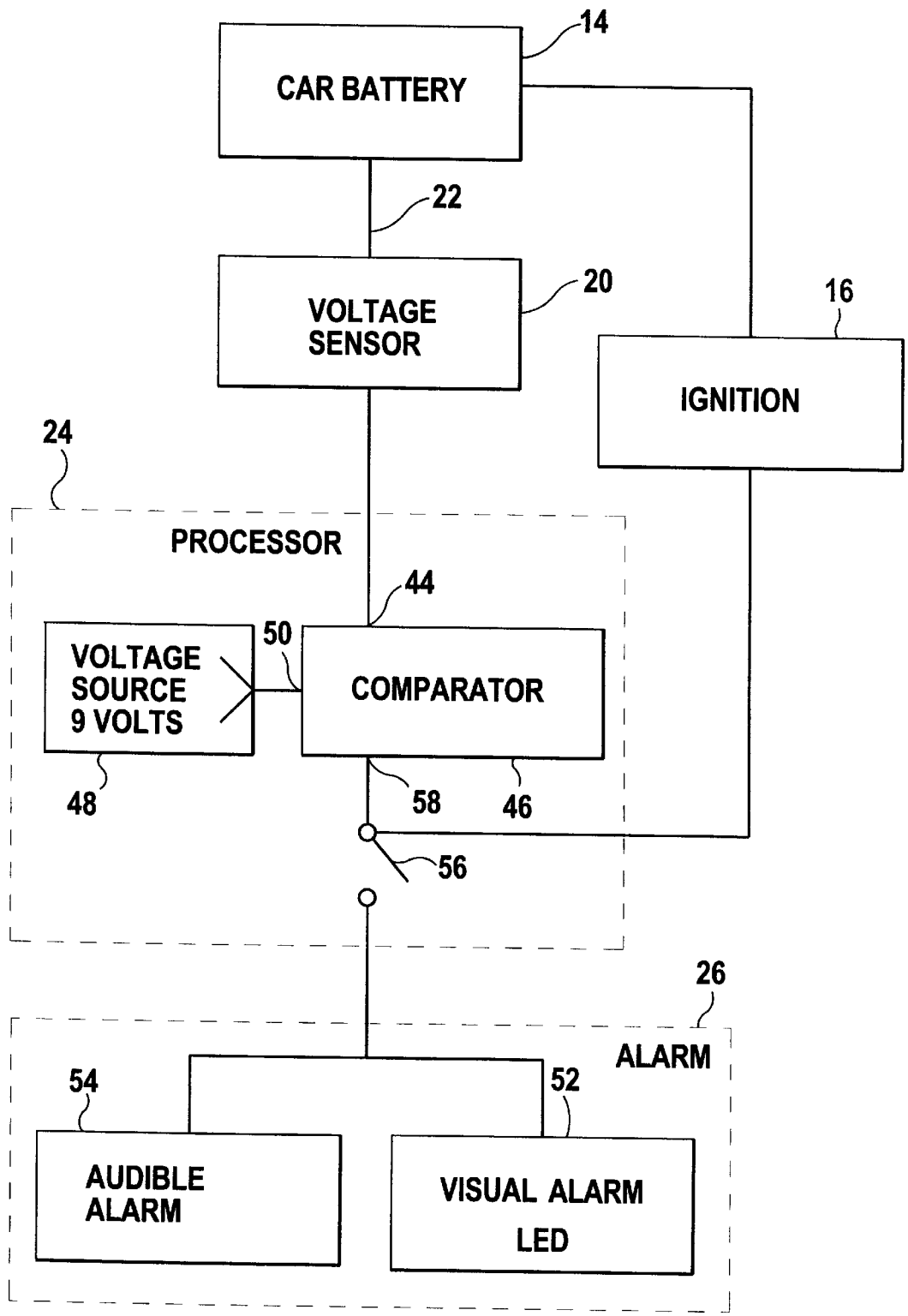
FIG. 5 is a block diagram of the low battery voltage detection and warning system of the present invention including a switch activation connected to the vehicle ignition.

FIG. 5 illustrates an alternate embodiment of the low battery voltage detection and warning system 18 including a switch 56 connected between an output 58 of the comparator 46 and the alarm 26. The vehicle battery 14 is connected to the ignition 16. The ignition 16 is connected to activate the switch 56 when a key is placed therein and turned to start the vehicle. Upon activation, the switch 56 is closed to connect the output 58 of the comparator 46 and the alarm 26. When the switch 56 is closed, the comparator 46 can activate the alarm 26 to produce at least one of the audible and visible alarm upon a determination of a low battery voltage condition. When the ignition 16 is not placed in the on position whereby the vehicle is allowed to start, the output 58 of the comparator 46 is disconnected from the alarm 26 thereby preventing the alarm 26 from being activated when the vehicle is not running.

Figure 6:
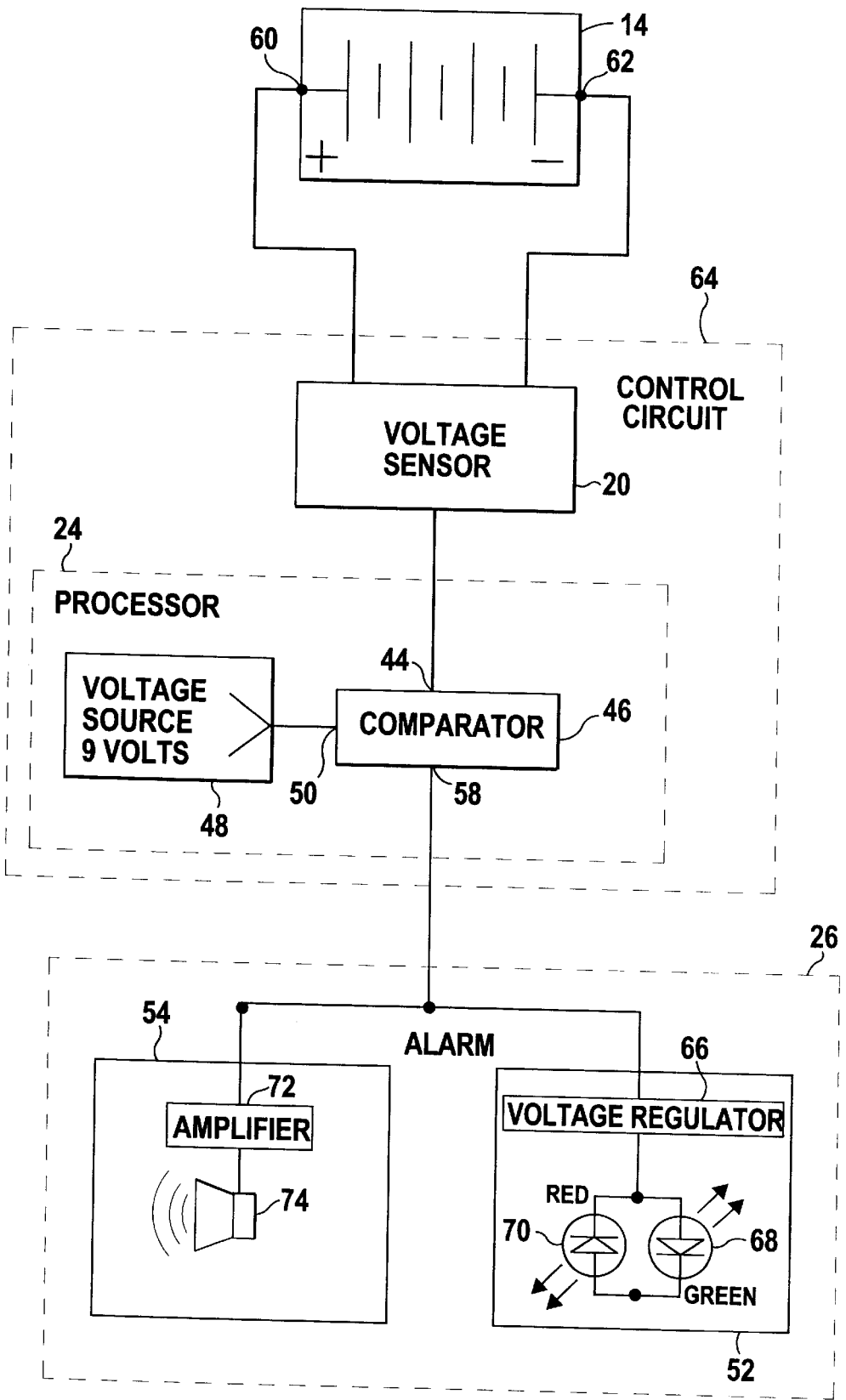
FIG. 6 is a block diagram of the low battery voltage detection and warning system of the present invention.

FIG. 6 illustrates the connection between the voltage sensor 20 and battery 14 in greater detail. As is shown in this figure, the voltage sensor 20 is connected to both a positive terminal 60 and a negative terminal 62 of the battery 14. This allows the voltage sensor 20 to measure the voltage drop across the terminals 60 and 62 of the battery 14 when the key in the ignition is turned to start the vehicle. In this illustration the voltage sensor 20 and processor 24 are shown as being integrally connected within a control circuit 64.

The control circuit 64 is connected to the alarm 26 which includes both a visible alarm 52 and an audible alarm 54. The visible alarm 52 includes a voltage generator 66, a green LED 68 and a red LED 70. The voltage regulator 66 is connected to the output 58 of the comparator 46 for regulating the amount of voltage provided by the comparator 46 to the visible alarm 52. The voltage regulator 66 is connected to both the green LED 68 and red LED 70. The green LED 68 is connected in a forward biased direction while the red LED 70 is connected in a reversed biased direction. Thus, when the comparator 46 provides a signal indicative of a sensed voltage below the reference voltage the green LED 68 is illuminated and when the comparator 46 provides a signal indicative of a sensed voltage above the reference voltage the red LED 70 is illuminated. The comparator 46 is also connected to an amplifier 72 within the audible alarm 54. The amplifier 72 provides an audible signal to a speaker 74 when the comparator 46 provides a signal indicative of a sensed voltage value below the reference voltage. Thus, when the sensed voltage is determined to be below the reference voltage the green LED 68 is illuminated and an audible alarm signal is generated. When the sensed voltage is determined to be above the reference voltage the red LED 70 is illuminated. The color of the LED's may be changed to produce a different color based upon the value of the sensed voltage. The red LED 70 can be connected to illuminate when the comparator 46 provides a signal indicative of a sensed voltage below the reference voltage by connecting it in a forward biased manner and the green LED 68 can be connected to illuminate when the comparator 46 provides a signal indicative of a sensed voltage above the reference voltage by connecting it in a reversed biased manner.

Figure 7:
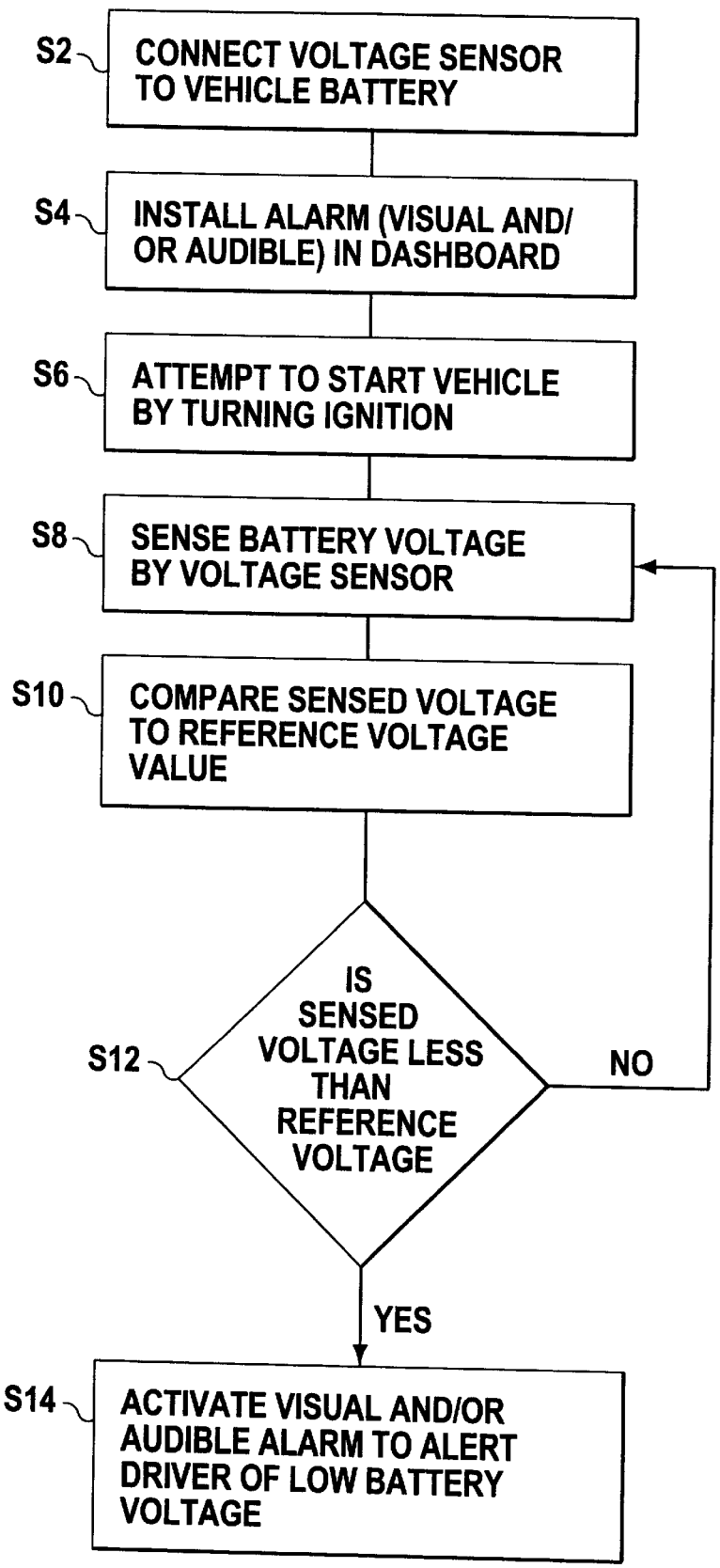
FIG. 7 is a flow diagram describing the use of the low battery voltage detection and warning system of the present invention.

The operation of the low battery voltage detection and warning system 18 will now be described with reference to the figures and specifically FIG. 7. In operation, the voltage sensor 20 is connected between the positive terminal 60 and negative terminal 62 of the vehicle battery as described in step S2. The visual alarm 52 and the audible alarm 54 are then connected within the vehicle so as to be readily viewable and audible to the operator of the vehicle such as in the dashboard as stated in step S4.

Once the low battery voltage detection and warning system 18 is installed in the vehicle 10, a key is placed in the ignition and an attempt is made to start the vehicle 10 as discussed in step S6. Upon starting the vehicle 10, the voltage charge stored in the battery 14 is sensed by the voltage sensor 20 as discussed in step S8. The sensed voltage is then transmitted to the processor 24 wherein it is compared with a reference voltage as stated in step S10. The reference voltage is of a value slightly above the voltage required to start the vehicle 10, wherein the voltage charge of the battery 14 will deteriorate to a value below that needed to start the vehicle 10 after a few more attempts to start the vehicle 10. A determination is then made in step S12 as to whether the sensed voltage is greater than or less than the reference voltage. If it is determined that the sensed voltage is greater than the reference voltage the device continues to sense the battery voltage until the vehicle is turned off or the sensed voltage value falls below that of the reference voltage. If it is determined that the sensed voltage value is below that of the reference voltage than the visual and/or audible alarms are activated to alert the driver as to the low sensed battery voltage as described in step S14. Upon activation of the alarm the operator of the vehicle is alerted to the fact that the vehicle battery must be checked or replaced.

From the above description it can be seen that the low battery voltage detection and warning system of the present invention is able to overcome the shortcomings of prior art devices by providing a low battery voltage detection and warning system which is able to measure a vehicle battery voltage and includes a device for determining if the battery voltage is below a predefined minimum value. The low battery voltage detection and warning system includes at least one of an audible and visual alarm for alerting the operator of the vehicle as to a low voltage measurement for the battery and is thus able to warn the operator of the vehicle that the battery voltage should be checked. The low battery voltage detection and warning system can also include a visual alarm which is able to indicate both low and normal battery voltage levels. The low battery voltage detection and warning system may also include a switch activated by the turning of the vehicle ignition and starting of the vehicle to initiate sensing of the start-up voltage of the vehicle battery and indicate if the vehicle battery voltage is above a predetermined value. Furthermore, the low battery voltage detection and warning system of the present invention is simple and easy to use and economical in cost to manufacture.

It will be understood that each of the elements described above, or two or more together may also find a useful application in other types of methods differing from the type described above.

While certain novel features of this invention have been shown and described and are pointed out in the annexed claims, it is not intended to be limited to the details above, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims:

1. In a vehicle having an engine, ignition, and a battery for starting said vehicle, a low battery voltage detection and warning system comprising:

a) a voltage sensor connected to said battery for sensing the full voltage value of said battery;
   b) a source of a fixed voltage which is the reference voltage;
   c) comparator means connected to said voltage sensor and to said reference voltage source for comparing the full voltage value of said battery with said reference voltage;
   d) an alarm connected to said comparator means for generating an alarm upon a determination by said comparator means that the voltage value of said battery is less than the reference voltage;
   e) an ignition switch connected between said alarm and said comparator means normally open when said ignition is off wherein activation of said ignition by closing of said switch energizes said alarm when the battery voltage value is below said reference voltage; and f) said alarm including means for indicating visually on the dashboard whether the battery voltage is above or below said reference voltage comprising a voltage regulator to regulate the amount of voltage provided by said comparator means and a green LED and a red LED connected to the output of said voltage regulator with said green LED in a forward biased direction and said red LED in a reversed bias direction so that said green LED is illuminated when said comparator means provides a signal indicative of a sensed voltage below the reference voltage and said red LED is illuminated when said comparator means provides a signal indicative of a sensed voltage above that of the reference voltage.

2. The low battery voltage detection and warning system of claim 1 in which said battery has positive and negative terminals and said voltage sensor is connected across said positive and negative terminals.

3. The low battery voltage detection and warning system of claim 2 in which an audible alarm is also generated when said battery voltage value is less than said reference voltage.

* * * * *